United States Patent [19]
Letavic et al.

[11] Patent Number: 6,028,337
[45] Date of Patent: Feb. 22, 2000

[54] LATERAL THIN-FILM SILICON-ON-INSULATOR (SOI) DEVICE HAVING LATERAL DEPLETION MEANS FOR DEPLETING A PORTION OF DRIFT REGION

[75] Inventors: Theodore Letavic, Putnam Valley; Mark Simpson, Ossining, both of N.Y.

[73] Assignee: Philips North America Corporation, New York, N.Y.

[21] Appl. No.: 09/187,874

[22] Filed: Nov. 6, 1998

[51] Int. Cl.⁷ ..................................................... H01L 27/12
[52] U.S. Cl. ........................ 257/347; 257/348; 257/349; 257/350; 257/339; 257/387; 257/491; 257/493
[58] Field of Search .................... 257/347–350, 257/339, 387, 491, 493

[56] References Cited

U.S. PATENT DOCUMENTS

| | | | |
|---|---|---|---|
| 5,246,870 | 9/1993 | Merchant | 437/21 |
| 5,300,448 | 4/1994 | Merchant et al. | 437/41 |
| 5,378,912 | 1/1995 | Pein | 257/335 |
| 5,412,241 | 5/1995 | Merchant | 257/409 |
| 5,648,671 | 7/1997 | Merchant | 257/347 |
| 5,710,451 | 1/1998 | Merchant | 257/347 |
| 5,874,768 | 2/1999 | Yamaguchi et al. | 257/339 |

FOREIGN PATENT DOCUMENTS

9805075A2 2/1998 WIPO.

OTHER PUBLICATIONS

PHA 23,337, U.S. Serial No. 08/998,048, Filed: Dec. 24, 1997.
PHA 23,475, U.S. Serial No. 09/122,407, Filed: Jul. 24, 1998.

Primary Examiner—Fetsum Abraham
Attorney, Agent, or Firm—ASteven R. Biren

[57] ABSTRACT

A lateral thin-film Silicon-On-Insulator (SOI) device includes a semiconductor substrate, a buried insulating layer on the substrate and a lateral MOS device on the buried insulating layer and having a source region of a first conductivity type formed in a body region of a second conductivity type opposite to that of the first. A lateral drift region of a first conductivity type is provided adjacent the body region, and a drain region of the first conductivity type is provided laterally spaced apart from the body region by the drift region. A gate electrode is provided over a part of the body region in which a channel region is formed during operation and over at least a part of the lateral drift region adjacent the body region, with the gate electrode being insulated from the body region and drift region by an insulation region. In order to provide an optimum combination of low "on" resistance and high breakdown voltage, additional structure is provided within the device for depleting a portion of the drift region adjacent the body region in a lateral direction during operation, in addition to the conventional depletion in the vertical direction which normally occurs in devices of this general type.

6 Claims, 3 Drawing Sheets

LATERAL THIN-FILM SILICON-ON-INSULATOR (SOI) DEVICE HAVING LATERAL DEPLETION MEANS FOR DEPLETING A PORTION OF DRIFT REGION

BACKGROUND OF THE INVENTION

The invention is in the field of Semiconductor-On-Insulator (SOI) devices, and relates more particularly to lateral SOI devices suitable for high-voltage applications.

In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks.

One particularly advantageous form of lateral thin-film SOI device includes a semiconductor substrate, a buried insulating layer on the substrate, and a lateral MOS device on the buried insulating layer, the MOS device, such as a MOSFET, including a semiconductor surface layer on the buried insulating layer and having a source region of a first conductivity type formed in a body region of a second conductivity type opposite to that of the first, an insulated gate electrode over a channel region of the body region and insulated therefrom, a lateral drift region of the first conductivity type, and a drain region of the first conductivity type laterally spaced apart from the channel region by the drift region.

A device of this type is shown in FIG. 1 common to related U.S. Pat. No. 5,246,870 (directed to a method) and U.S. Pat. No. 5,412,241 (directed to a device), commonly-assigned with the instant application and incorporated herein by reference. The device shown in FIG. 1 of the aforementioned patents is a lateral SOI MOSFET device having various features, such as a thinned SOI layer with a linear lateral doping region and an overlying field plate, to enhance operation. As is conventional, this device is an n-channel or NMOS transistor, with n-type source and drain regions, manufactured using a process conventionally referred to as NMOS technology.

More advanced techniques for enhancing high-voltage and high-current performance parameters of SOI power devices are shown in U.S. patent application Ser. No. 08/998,048, filed Dec. 24, 1997, commonly-assigned with the instant application and incorporated herein by reference. Yet another technique for improving the performance of an SOI device is to form a hybrid device, which combines more than one type of device configuration into a single structure. Thus, for example, in U.S. patent application Ser. No. 09/122,407, filed Jul. 24, 1998, commonly-assigned with the instant application and incorporated herein by reference, an SOI device is disclosed which includes a lateral DMOS transistor and an LIGB transistor in the same structure.

Thus, it will be apparent that numerous techniques and approaches have been used in order to enhance the performance of power semiconductor devices, in an ongoing effort to attain a more nearly optimum combination of such parameters as breakdown voltage, size; current-carrying capability and manufacturing ease. While all of the foregoing structures provide varying levels of improvement in device performance, no one device or structure fully optimizes all of the design requirements for high-voltage, high-current operation.

Accordingly, it would be desirable to have a transistor device structure capable of high performance in a high-voltage, high-current environment, in which operating parameters, and in particular "on" resistance and breakdown voltage are further optimized.

SUMMARY OF THE INVENTION

It is therefore an object of the present invention to provide a transistor device structure capable of high-performance in a high-voltage, high-current environment. It is a further object of the invention to provide such a transistor device structure in which operating parameters such as "on" resistance and breakdown voltage are enhanced.

In accordance with the invention, these objects are achieved in a lateral thin-film SOI device structure of the type described above in which means are provided for depleting a portion of the drift region adjacent the body region in a lateral direction during operation, in addition to the conventional substantially vertical depletion mode employed in prior-art devices.

In a preferred embodiment of the invention, the means for depleting a portion of the drift region comprises a plurality of finger-shaped regions of the second conductivity type extending from the body region into the drift region.

In a further preferred embodiment of the invention, the means for depleting a portion of the drift region comprises a floating region of the second conductivity type which is located adjacent to but not in direct contact with the body region and at the surface of the drift region. This floating region may either be a substantially continuous region, or else may comprise a plurality of parallel, spaced-apart region segments extending in a direction from the body region to the drain region. In structures where the insulation region comprises a portion beneath the gate electrode and above the lateral drift region which varies in thickness, the floating region can advantageously be located substantially beneath the portion which varies in thickness.

Lateral thin-film SOI devices in accordance with the present invention offer a significant improvement in that a combination of favorable performance characteristics making the devices suitable for operation in a high-voltage, high-current environment, such as low "on" resistance and high breakdown voltage, can be achieved.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
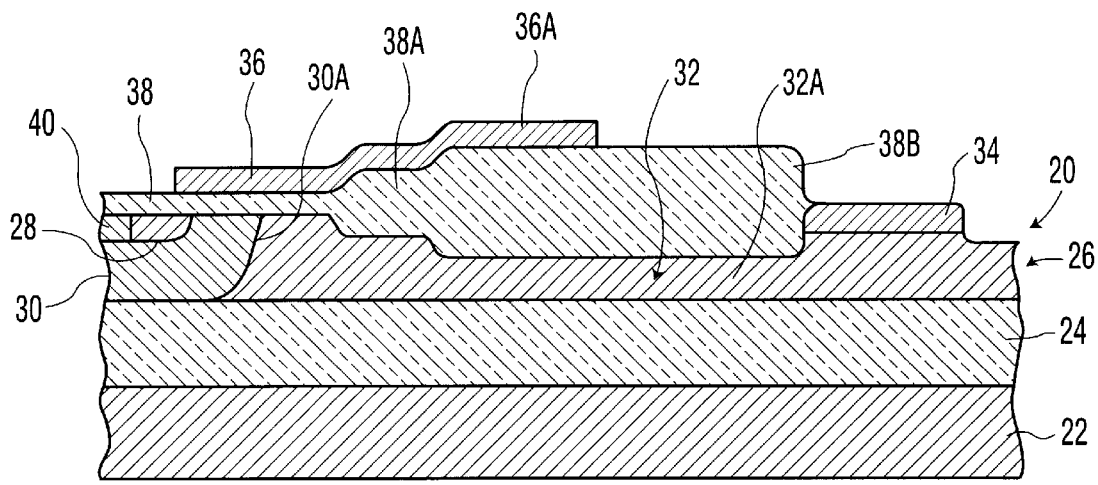
FIG. 1 shows a simplified cross-sectional view of a lateral thin-film SOI device in accordance with a preferred embodiment of the invention taken along the line 1—1 in FIG. 3.

In the drawing, semiconductor regions having the same conductivity type are generally shown hatched in the same direction in the cross-sectional views, and it should be understood that the figures are not drawn to scale.

DESCRIPTION OF THE PREFERRED EMBODIMENTS

Figure 2:
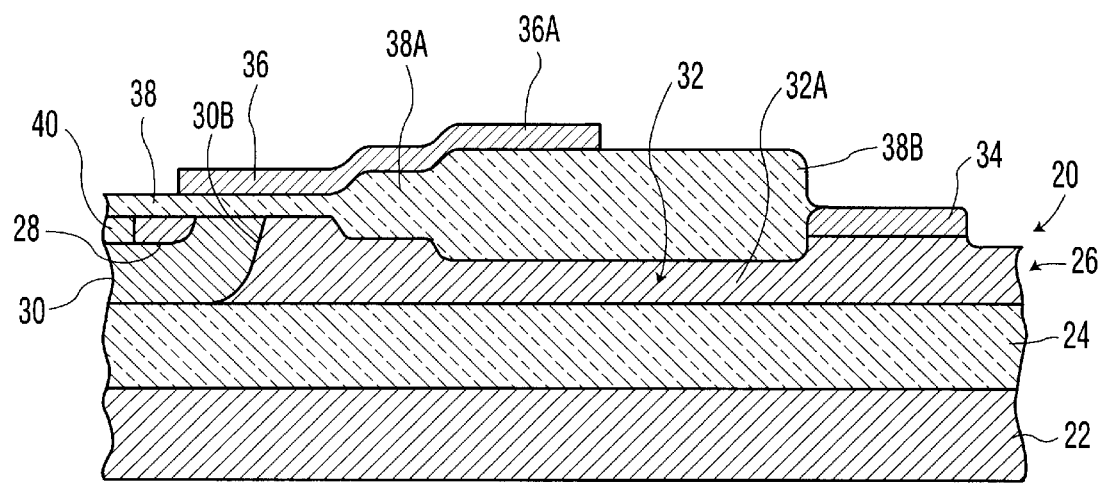
FIG. 2 shows a simplified cross-sectional view of a lateral thin-film SOI device in accordance with a preferred embodiment of the invention taken along the line 2—2 in FIG. 3.

In the simplified cross-sectional views of FIGS. 1 and 2, a lateral thin-film SOI MOS transistor 20 includes a semiconductor substrate 22, a buried insulating layer 24, and a semiconductor surface layer 26 in which the device is fabricated. The MOS transistor includes a source region 28 of one conductivity type, a body region 30 of a second, opposite conductivity type, a lateral drift region 32 of the first conductivity and a drain region 34, also of the first conductivity type. The basic device structure is completed by a gate electrode 36, insulated from the underlying semiconductor surface layer 26 by an oxide insulation region 38. Within the scope of the invention, the MOS transistor structure used in the present invention may have various performance-enhancing features, such as a stepped oxide region 38A, 38B, an extended gate electrode structure forming a field plate portion 36A, and a thinned lateral drift region portion 32A, all as detailed in the aforementioned prior art, or other performance-enhancing features as desired, without departing from the spirit or scope of the invention. Additionally, the MOS transistor 20 may also include a surface contact region 40, in contact with source region 28, located in the body region 30 and of the same conductivity type as the body region but more highly doped.

It will be understood that the simplified, representative devices shown in the Figures depict particular device structures, but that wide variations in both device geometry and configuration can be used within the scope of the invention.

The key difference between the cross-sectional views shown in FIGS. 1 and 2 involves the body region 30, and in particular the lateral extent thereof. Thus, the right edge 30A of body region 30 adjoining the drift region 32 is located considerably closer to the source region 30 than is the right edge 30B of the body region 30 shown in FIG. 2.

Figure 3:
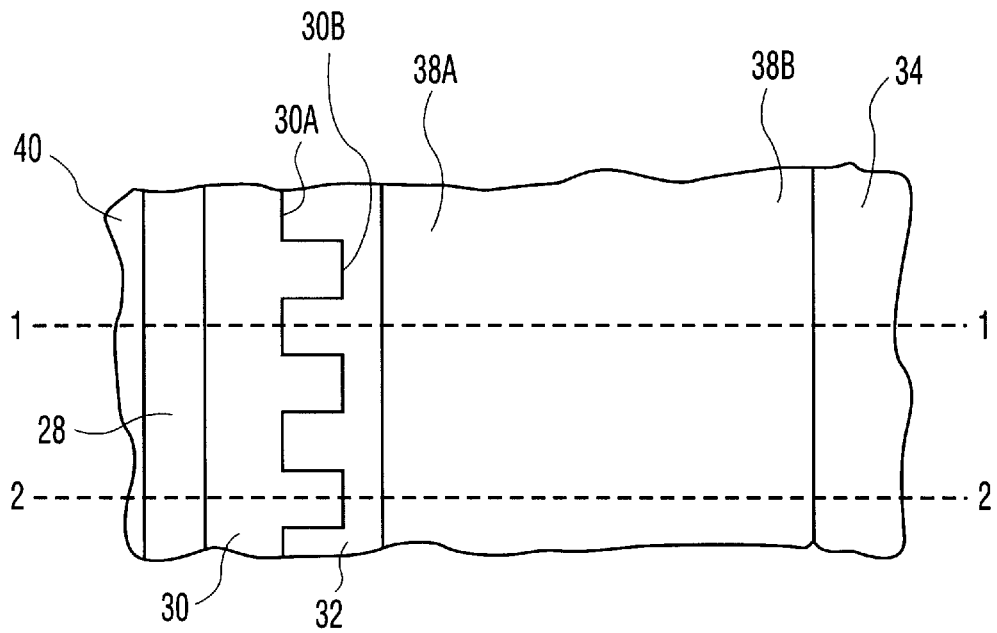
FIG. 3 shows a simplified plan view of the lateral thin-film SOI device of FIGS. 1 and 2.

In the simplified plan view of FIG. 3, the different lateral extents of 30A and 30B of the body region 30 can be clearly seen as forming a plurality of finger-shaped regions at 30B extending from the body region 30 and spaced apart by the regions at 30A. While it will be recognized that the invention is not limited to any particular configuration of the fingers, by way of nonlimitative example the fingers 30B may typically extend out about 2 microns from the edge 30A of the body region 30, and both the width of the fingers and the spacing between fingers may also be about 2 microns. In a device in which the body region is a p-type conductivity, the charge dose of both the fingers 30B and the body region 30 may be about $3e^{13}$ at/cm². The finger-shaped regions may be easily fabricated in various manners apparent to those of ordinary skill in the art, such as by using implantation through a notched mask and diffusion or by simply notching an overlying polysilicon layer where the extensions are desired and then implanting and diffusing the body region. Since the remainder of the device is conventional, both as to its configuration and its fabrication methods, these will not be described in further detail.

Figure 4:
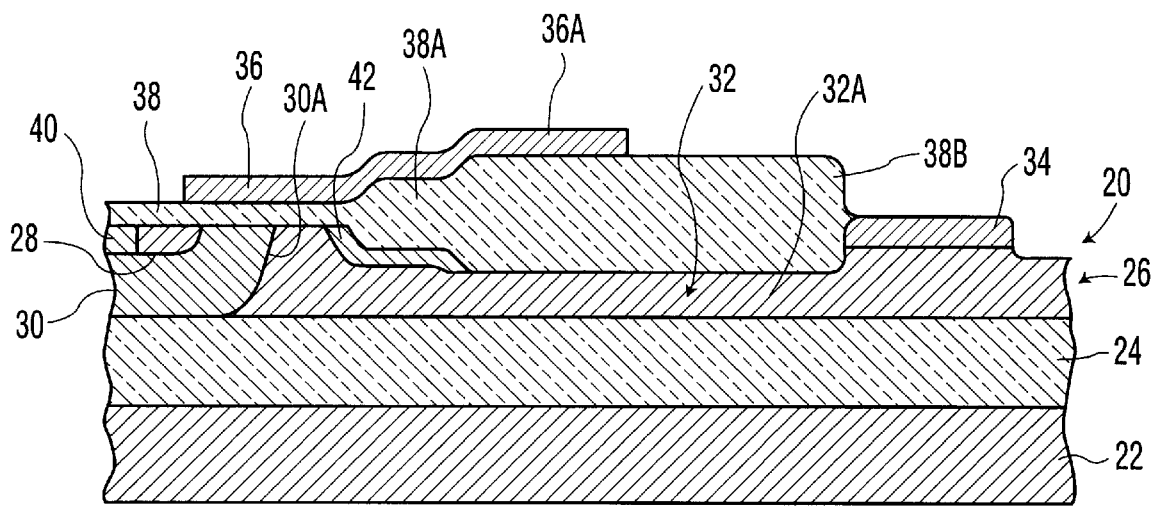
FIG. 4 shows a simplified cross-sectional view of a further preferred embodiment of a lateral thin-film SOI device in accordance with the invention taken along the line 4—4 in FIG. 5.

The purpose of providing finger-shaped regions extending from the body region into the drift region is to create a structure for depleting a portion of the drift region adjacent the body region in the lateral direction, as well as in the vertical direction as with prior-art devices. An alternate embodiment for accomplishing this result is shown in FIG. 4, which is similar to FIG. 1 except that a floating region 42 is provided adjacent to but not in direct contact with the body region 30 and at the surface of the drift region 32. This floating region is of the same conductivity type as that of the body region and may typically have a length (i.e. a lateral extent from left to right as shown in FIG. 4) comparable to the maximum thickness of the oxide region at 38B, although the precise length is not critical to the functioning of the invention. Again by way of nonlimitative example, assuming that the body region and the floating region are of p-type conductivity, a typical charge dose for the floating region may be about $2e^{12}$ at/cm², with a thickness of about 0.1 micron.

Figure 5:
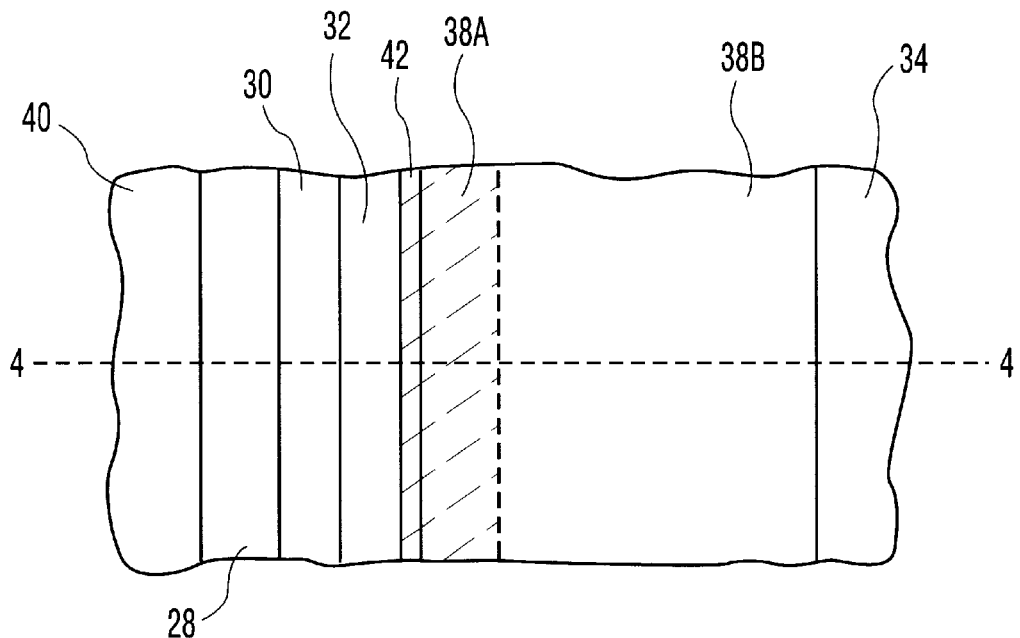
FIG. 5 shows a simplified plan view of the lateral thin-film SOI device of FIG. 4.
Figure 6:
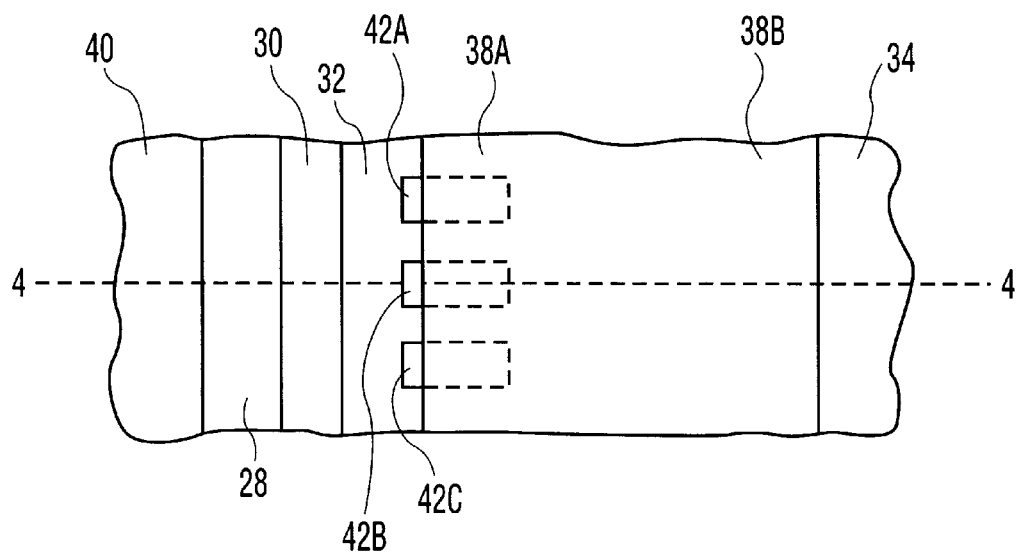
FIG. 6 shows a simplified plan view of an alternate embodiment of the lateral thin-film SOI device shown in FIG. 5.

When viewed from above, the floating region 42 may be formed by either a substantially continuous region, as shown in the simplified plan view of FIG. 5, or else as a plurality of parallel, spaced-apart region segments 42A, 42B, 42C, etc. extending in a direction from the body region to the drain region. While the invention is not limited to any particular segment width or spacing, the segments 42A, 42B, 42C may be about 2 microns wide and separated by about 2 microns.

It has been recognized that it may be advantageous for the insulation region 38 to be formed in a stepped manner, with a portion 38A being of intermediate thickness between a thin portion 38 and a thick portion 38B. If this configuration is employed, it will be advantageous to provide the floating region 42 substantially beneath the stepped portion 38A where the insulation region varies in thickness, as shown in FIG. 4.

As noted above, the object of the present invention is to provide a lateral SOI device structure in which the tradeoff between the operating parameters of "on" resistance and breakdown voltage are further enhanced as compared to prior-art devices. This enhancement is provided by a device structure in which a portion of the drift region adjacent the body region is depleted in the lateral direction, as well as in the vertical direction as in prior-art devices, during operation. In devices of the general type described herein, "on" resistance is typically reduced by increasing the amount of charge which is placed in the lightly-doped drift region of the device. However, as this charge level is increased to reduce the "on" resistance, the electrical field increases as well, thus resulting in a reduction of the breakdown voltage of the device. The effects of an increased electrical field are particularly detrimental in the area of the device where the body region and drift region meet, and in particular at areas where the top oxide is changing in thickness. It is believed that the present invention reduces the electric field level at these points by providing an additional depletion mode, namely in the lateral direction, in this region of the device. Since devices in accordance with the invention will thus deplete laterally, as well as vertically as in prior-art devices, the amount of charge which can be placed in the lightly-doped drift region can be increased, and thus a lower "on" resistance can be obtained for a specified breakdown voltage. Alternately, for a specified "on" resistance, a higher breakdown voltage can be obtained.

In this manner, the present invention provides a transistor device structure capable of high-performance in a high-voltage, high-current environment, while enhancing the operating parameters of "on" resistance and breakdown voltage.

While the invention has been particularly shown and described with reference to several preferred embodiments thereof, it will be understood by those skilled in the art that various changes in form and detail may be made without departing from the spirit or scope of the invention.

What is claimed is:

1. A lateral thin-film Silicon-On-Insulator (SOI) device comprising a semiconductor substrate, a buried insulating layer on said substrate, and a lateral MOS device in an SOI layer on said buried insulating layer and having a source region of a first conductivity type formed in a body region of a second conductivity type opposite to that of the first, a lateral drift region of said first conductivity type adjacent said body region, a drain region of said first conductivity type and laterally spaced apart from said body region by said lateral drift region, and a gate electrode over a part of said body region in which a channel region is formed during operation and over at least a part of said lateral drift region adjacent said body region, said gate electrode being insulated from said body region and drift region by an insulation region, further comprising means in said SOI layer for depleting a portion of said drift region adjacent said body region in a lateral direction during operation.

2. A lateral thin-film Silicon-On-Insulator (SOI) device as in claim 1, wherein said means in said SOI layer for depleting a portion of said drift region comprises a plurality of finger-shaped regions of said second conductivity type extending from said body region into said drift region.

3. A lateral thin-film Silicon-On-Insulator (SOI) device as in claim 1, wherein said means in said SOI layer for depleting a portion of said drift region comprises a floating region of said second conductivity type adjacent to but not in direct contact with said body region and at the surface of said drift region.

4. A lateral thin-film Silicon-On-Insulator (SOI) device as in claim 3, wherein said floating region comprises a substantially continuous region.

5. A lateral thin-film Silicon-On-Insulator (SOI) device as in claim 3, wherein said floating region comprises a plurality of parallel, spaced-apart region segments extending in a direction from said body region to said drain region.

6. A lateral thin-film Silicon-On-Insulator (SOI) device as in claim 3, wherein said insulation region comprises a portion beneath said gate electrode and above said lateral drift region which varies in thickness, and said floating region is located substantially beneath said portion which varies in thickness.

* * * * *